United States Patent
Kemmochi et al.

(10) Patent No.: US 7,383,696 B2
(45) Date of Patent: *Jun. 10, 2008

(54) SILICA GLASS CRUCIBLE WITH BUBBLE-FREE AND REDUCED BUBBLE GROWTH WALL

(75) Inventors: Katsuhiko Kemmochi, Camas, WA (US); Robert Mosier, Camas, WA (US); Yasuo Ohama, Fukui (JP)

(73) Assignee: Heraeus Shin-Etsu America, Inc., Camas, WA (US)

( * ) Notice: Subject to any disclaimer, the term of this patent is extended or adjusted under 35 U.S.C. 154(b) by 208 days.

This patent is subject to a terminal disclaimer.

(21) Appl. No.: 11/223,158

(22) Filed: Sep. 8, 2005

(65) Prior Publication Data

US 2007/0051296 A1    Mar. 8, 2007

(51) Int. Cl.
*C30B 35/00* (2006.01)
(52) U.S. Cl. .............. 65/60.1; 65/DIG. 8; 117/200; 117/900
(58) Field of Classification Search ............ 117/200, 117/900; 65/60.1, 60.5, 63, DIG. 8
See application file for complete search history.

(56) References Cited

U.S. PATENT DOCUMENTS

| | | | |
|---|---|---|---|
| 4,416,680 A | 11/1983 | Brüning et al. | |
| 4,632,686 A | 12/1986 | Brown et al. | |
| 4,637,571 A | 1/1987 | Holder et al. | |
| 4,935,046 A | 6/1990 | Uchikawa et al. | |
| 4,956,208 A | 9/1990 | Uchikawa et al. | |
| 5,730,800 A * | 3/1998 | Sato et al. | 118/200 |
| 5,885,071 A | 3/1999 | Watanabe et al. | |
| 5,976,247 A | 11/1999 | Hansen et al. | |
| 5,980,629 A | 11/1999 | Hansen et al. | |
| 5,989,021 A | 11/1999 | Sato et al. | |
| 6,136,092 A | 10/2000 | Sato et al. | |
| 6,319,313 B1 | 11/2001 | Phillips et al. | |
| 6,350,312 B1 | 2/2002 | Phillips et al. | |
| 6,461,427 B2 | 10/2002 | Phillips et al. | |
| 6,510,707 B2 | 1/2003 | Kemmochi et al. | |
| 6,641,663 B2 * | 11/2003 | Kemmochi et al. | 117/200 |
| 6,797,061 B2 | 9/2004 | Sato et al. | |
| 2001/0032580 A1 | 10/2001 | Phillips et al. | |

(Continued)

FOREIGN PATENT DOCUMENTS

EP    0911429    4/1999

(Continued)

OTHER PUBLICATIONS

English translation of Japanese Patent No. 10-215184, publsihed Jan. 27, 1998.

*Primary Examiner*—Felisa Hiteshew
(74) *Attorney, Agent, or Firm*—Marger Johnson & McCollom, PC

(57) ABSTRACT

A silica glass crucible includes a stable, bubble-free inner layer and an opaque outer layer, both layers demonstrating reduced bubble growth during a Czochralski process. When used in the CZ process, little volume change is observed in the crucible wall, and the crucible has little influence on melt level. The present crucible is especially suited for slow silicon ingot pulling with reduced crystalline defects. The fusion process of the present invention controls the dynamic gas balance at the fusion front where formed grain is melted to dense fused silica.

19 Claims, 17 Drawing Sheets

U.S. PATENT DOCUMENTS

2002/0086119 A1    7/2002    Hariharan et al.

FOREIGN PATENT DOCUMENTS

| | | |
|---|---|---|
| JP | 1126238 | 5/1989 |
| JP | 6219768 | 8/1994 |
| JP | H8-2932 | 1/1996 |
| JP | 8040737 | 2/1996 |
| JP | 09-255476 | 9/1997 |
| JP | 10-25184 | 1/1998 |
| JP | 2000-247778 | 9/2000 |
| WO | 00/55394 | 9/2000 |
| WO | 00/55395 | 9/2000 |
| WO | 02/40732 | 5/2002 |

\* cited by examiner

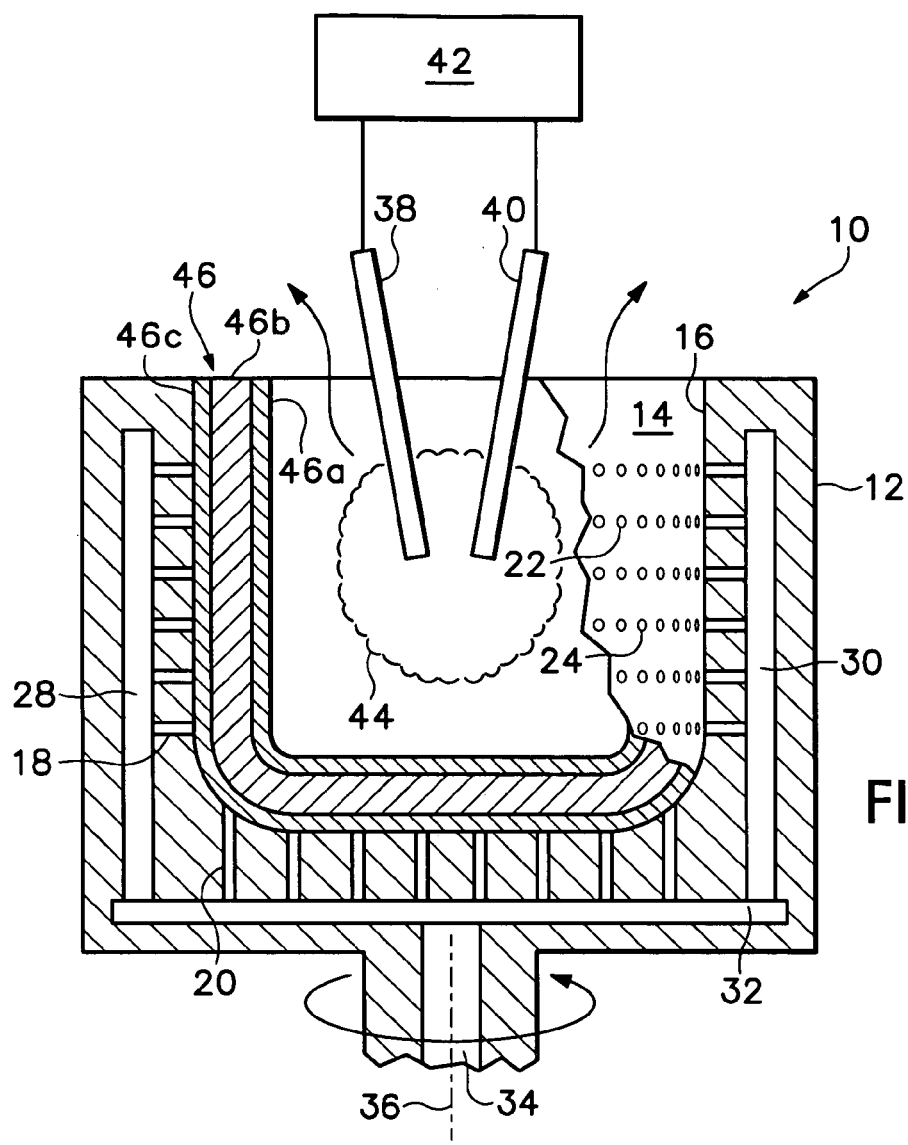
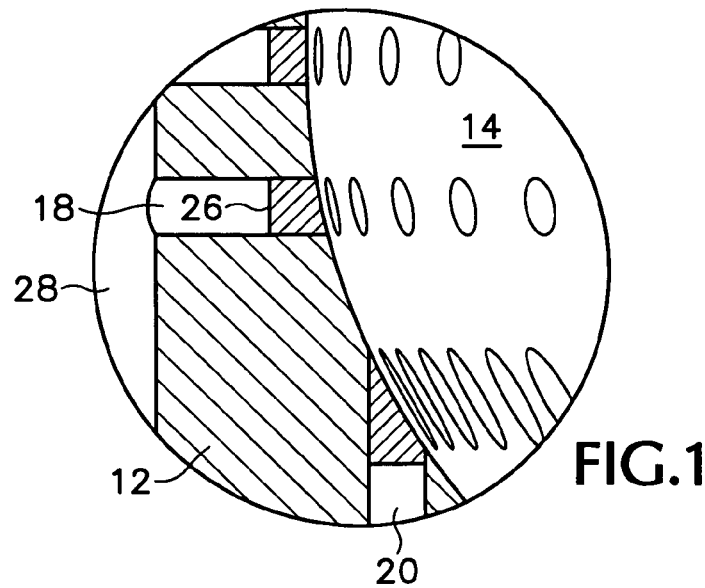

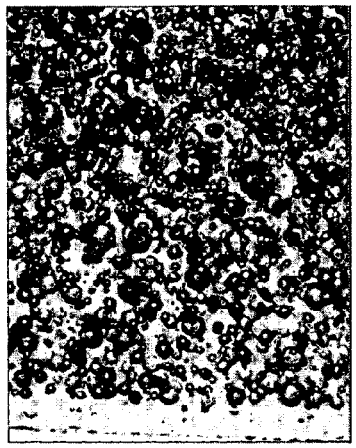
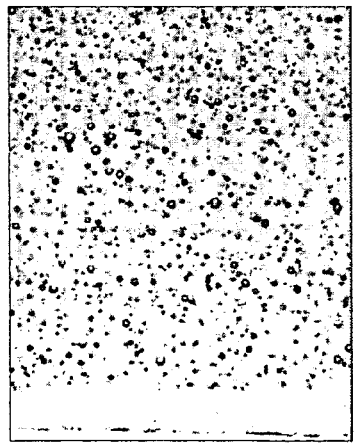
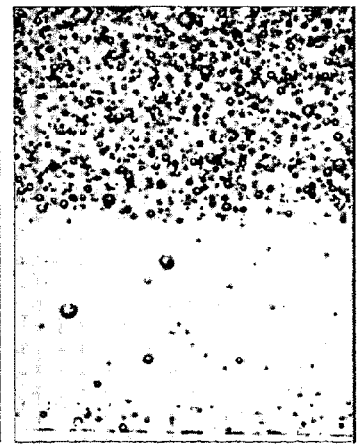
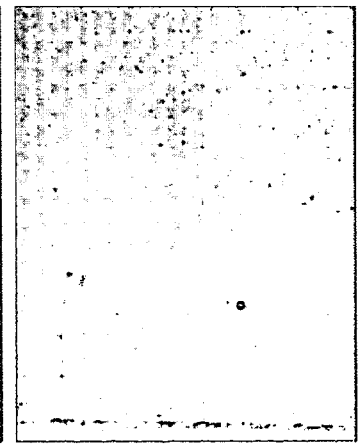
FIG.8B (PRIOR ART)
FIG.9B
FIG.10B
FIG.8A (PRIOR ART)
FIG.9A
FIG.10A
After VBT
As fused

SILICA GLASS CRUCIBLE WITH BUBBLE-FREE AND REDUCED BUBBLE GROWTH WALL

BACKGROUND OF THE INVENTION

1. Field of the Invention

The present invention relates to the field of silica crucibles and more particularly to a silica crucible having a multilayer wall with a bubble-free inner layer that is subject to very little bubble growth when holding molten silicon and an outer layer that is opaque and stable.

2. Background of the Invention

Silicon wafers used in the semiconductor industry are made from ingots of single crystalline silicon. Such ingots generally are manufactured using the Czochralski (CZ) process. In the CZ process, metallic silicon is charged in a silica glass crucible housed within a susceptor that is received in a crystal growth chamber. A heater surrounding the susceptor heats the charge thus melting the silicon. A single silicon crystal is pulled from the silicon melt at or near the melting temperature of silicon.

At operating temperatures, the innermost layer of a silica crucible reacts with the silicon melt by dissolving into the silicon melt during the CZ-process. Any bubbles in the inner layer tend to open to the melt during such dissolution. This is a source of particles in the melt, which may disturb the single crystal structure of the pulled ingot. A bubble-free inner layer has been a critical requirement for a crucible adapted for the CZ process.

Recently, demand in the semiconductor industry is for large diameter wafers, e.g., 200 mm or 300 mm in diameter. Pulling multiple ingots by recharging silicon after each pull has became a popular modification of the traditional CZ process. As a result, the CZ process operating period is increased, frequently to more than one hundred hours. This CZ process means that the thickness of the bubble-free layer must also be increased. In the case of a crucible used for 150 mm-diameter wafer production, a crucible having bubble-free inner layer thickness of one millimeter was sufficient. It is not uncommon, however, to dissolve more than two millimeters of a silica crucible inner layer when pulling 200 mm or 300 mm diameter ingots.

In addition, the longer operating time means that bubble growth in the inner layer during the CZ process must be minimal. A miniscule bubble in a fused crucible may grow in size during operation. Larger bubbles are prone to release larger particles, causing potentially greater harm to the ingot. When the CZ process proceeds for long times, evolution of bubbles is routinely observed. These growing bubbles result from gas that is dissolved in the inner layer and may be essentially invisible after the crucible is formed. Minimizing evolution and growth of bubbles is very important for crucibles used in modern CZ process applications.

Although it is important to minimize bubbles and bubble growth in the inner layer, it is well known that the outer layer of a multi-layer crucible used for the CZ process must include bubbles to make the outer layer opaque. This creates a layer that diffuses thermal radiation. The importance of the mechanical stiffness and integrity of the crucible sidewall has been recently identified for large crucibles, such as those of 550 mm diameter (nominal 22-inch) or greater. We have found that bubble growth in the opaque layer results in a swelling of the crucible wall. During the CZ process the crucible resides in a rigid graphite susceptor. It nonetheless experiences an increase in wall volume. This volume change causes a serious quality problem in the pulled ingot, especially when the silicon melt level movement is relatively low or the ingot pulling speed is slow. But all other things being equal, slow pulling produces high quality ingots. As a result, it is desirable to prevent wall volume changes to permit slow pulling speeds.

BRIEF DESCRIPTION OF THE DRAWINGS

FIG. 1 is a cross-sectional side view of a somewhat schematic view of a crucible mold as disclosed herein.

FIG. 1A is an enlarged cross-sectional side view of an air channel of the crucible mold of FIG. 1.

FIG. 8A is a photomicrograph of a section of a wall of a crucible that was constructed generally in accordance with a prior art process.

FIG. 8B is a photomicrograph of a section of the wall of a crucible that was constructed generally in accordance with the process of FIG. 8A after the crucible was subject to a vacuum bake test.

FIG. 9A is a photomicrograph of a section of a wall of a crucible that was constructed generally in accordance with the process of FIGS. 7A and 7B.

FIG. 9B is a photomicrograph of a section of the wall of a crucible that was constructed generally in accordance with the process of FIGS. 7A and 7B after the crucible was subject to a vacuum bake test.

FIG. 10A is a photomicrograph of a section of a wall of a crucible that was constructed generally in accordance with a modified version of the process of FIGS. 7A and 7B.

FIG. 10B is a photomicrograph of a section of the wall of a crucible that was constructed generally in accordance with the modified version of the process of FIGS. 7A and 7B after the crucible was subject to a vacuum bake test.

DETAILED DESCRIPTION OF THE PREFERRED EMBODIMENTS

Figure 2A:
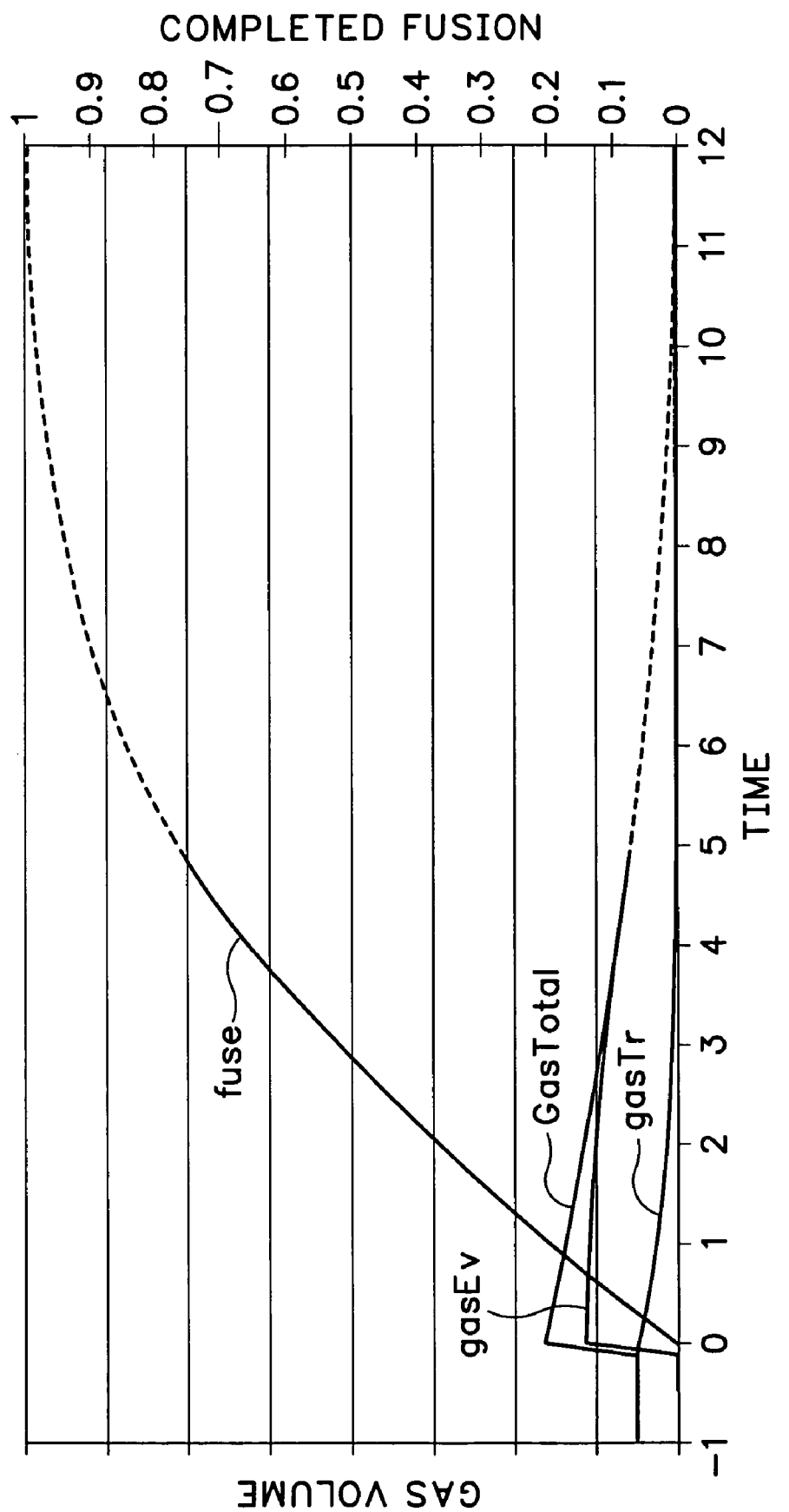
FIG. 2A is a graph depicting various gas levels and the fusion rate according to a model of a process for fusing a crucible inner layer in accordance with the prior art.

One aspect of the present invention provides a silica glass crucible comprising an inner layer that is thick enough for prolonged operation and is free of bubbles and bubble growth. The crucible further comprises a stable outer layer that shows little swelling during multiple ingot pulls.

The crucible has a bubble-free ("BF") and no-bubble-growth ("NBG") clear inner layer, which is 2 mm or more thick, and a stable opaque outer layer. Stability of the outer layer is determined using a vacuum bake test ("VBT"), in which wall thickness change, which corresponds to apparent density, is measured after baking the crucible at approximately 1650 degrees C. for approximately three hours at a pressure of approximately 0.1 Pa. More specifically, an observed thickness increase of the present crucible after the VBT is less than 1%, and the apparent density after the VBT is more than 2.05 g/cm$^3$.

A silica glass crucible according to this aspect of the invention is made by introducing bulk silica grain, comprising essentially quartz grain, into a rotating crucible mold. This forms a bulky wall. The formed grain is then heated to fuse a crucible while a pump communicating with the mold draws air through the formed grain, gas released from the calcined grain, and gas released from grain as it fuses. The total gas is dynamically balanced with the conductance of a flow passageway connecting the inner mold surface with the pump and the evacuation power of the pump. This dynamic balance is controlled to keep a balance of mass at the gaseous phase at the fusion front in the formed grain less than a threshold value that is required to make a BF or NBG silica glass layer.

The apparatus to make the crucible has a flow passageway connecting the inner mold surface with the pump, in which flow resistance is low enough, and a pumping power is high enough to achieve the required dynamic balance. The flow passageway can include structures such as, e.g., piping, valves, gauges, and the gas-permeable mold itself. The flow resistance of the gas-permeable mold can be controlled using channels in the graphite mold and a porous material facing, such as graphite, on the inside of the mold.

The heat to fuse the formed grain must be intense enough to cook the fused silica so that gas is not released during the CZ process. Such gas release causes formation of bubbles and bubble growth in the crucible wall. This gas release results in swelling of the crucible wall, which in turn causes perturbations of the melt level.

In more detail, one aspect of the present invention provides a silica glass crucible suitable for use in a CZ process. The crucible has a bubble-free inner layer that is 2 mm or more in thickness and an opaque outer layer. The wall thickness change after a VBT, which is an accelerated simulation of a CZ process, is equal to or less than 3%, preferably less than 1%. In other words, the apparent density of the crucible wall after the VBT is equal to or greater than 2.05 g/cm$^3$. This small thickness change is a result of combination of minimal bubble growth in the opaque layer and minimal bubble evolution and growth in the inner layer.

After the VBT, the inner bubble-free layer contains less than 1% bubbles by volume in cross-sectional area and the individual bubbles will not grow more than 0.3 mm in diameter. Bubble content is measured as a ratio of the sum of bubble image area divided by total area in a cross section picture of transmission optical microscope. The bubble size is also measured using a transmission optical microscope.

The wall thickness change of the entire wall is measured with a micrometer. The opaque layer is preferably 50% to 70% of the wall and 25% at minimum to satisfy good heat diffusing characteristics. The apparent density of the opaque layer after a VBT is preferably greater than 2.05 g/cm$^3$.

Turning attention now to FIGS. 1 and 1A, indicated generally at 10 is a system for fusing a silica crucible in accordance with the present invention. The system includes a mold 12 having an inner mold surface 14. Mold surface 14 includes a substantially cylindrical vertical wall 16. In the mold of FIG. 1, wall 16 defines a cylindrical cavity having a diameter of about 620 mm, but the invention may be equally well practiced with molds having both smaller and larger diameters.

A plurality of air channels, like air channels 18, 20 (viewable in both FIGS. 1 and 1A) communicate with inner mold surface 14. Each air channel comprises a cylindrical bore that creates a circular opening, like openings 22, 24, on mold surface 14. Each air channel, like channel 20 in FIG. 1A, includes a porous graphite plug, like plug 26, which prevents silica from being drawn from the mold cavity into the air channels. The air channels communicate with manifolds, like manifolds 28, 30, 32, which in turn communicate with a bore 34. A pump (not visible in the drawings) is connected to bore 34. The pump is configured to draw air from the mold cavity via the air channels and ultimately through bore 34 and out of system 10. The pump typically has a capacity of between about 80 and 350 cubic meters per hour, although as will be seen, the invention may be practiced with pumps outside this range depending on the conductivity of the channels, bores, manifolds, valves, and other structure disposed between mold surface 14 and the pump. All of the structure disposed between mold surface 14 and the pump is referred to herein as a flow passageway.

Mold 12 can be rotated by a motor (not shown) about a vertical axis 36. A set of conventional electrodes 38, 40 is vertically movable into and out of the mold interior. The electrodes are connected to a conventional DC power supply 42 that can apply power to the electrodes in a selectable range between about 300 KVA and 1200 KVA. When sufficient power is applied to electrodes 12, 14, an extremely hot plasma gas ball 38 forms around the electrodes.

Mold 12 contains a layer 46 of partially fused silica, which is shown partially broken away to expose mold surface 14. Layer 46 includes an inner layer 46a and an outer layer 46b. Together layers 46a, 46b comprise the wall of a crucible formed in the mold. A thin layer of unfused grain 46c is left because temperature at the inner mold surface cannot reach the melting point of the formed grain.

Generally describing the operation of system 10, natural quartz grain is placed in mold 12 as it rotates about axis 36. Preferably, the outer layer of the crucible, i.e., the first grain received in the mold is doped with aluminum in the manner described in U.S. patent application Ser. No. 09/906,879, filed Jul. 16, 2001, which is assigned to the assignee of the present application and is hereby incorporated by reference for all purposes. Once all the grain is received in the mold, power is applied to electrodes 38, 40 and the pump (not visible) is turned on. Once the electrodes heat the grain to the point were the grains on the innermost surface of wall 46a being to fuse, a fusion front forms and proceeds over time from the innermost surface of the crucible to near mold surface 14, where the fusion front saturates. As will be explained, when the gas evolved from the heated and fusing grain plus the gas drawn through the unfused grain, through both the inner surface of layer 46a and the upper surface of wall 46, bears a predetermined relationship with the pump power and the conductivity of the flow passageway, the qualities of the formed crucible may be precisely controlled.

There are several requirements of balance for the key parameters. First, assume the amount of fused silica as a function of time t is G(t).

Initially, the rate of fused silica increases slowly due to time spent preheating the silica to the required melting temperature. A fused silica-grain interface then proceeds promptly until it approaches the mold inner surface. At a certain point, the fusion front saturates, leaving unfused grain between the mold and the fused crucible. It has been found that G(t) can be approximately expressed by an error function.

When fusion proceeds, a significant amount of gas is evolved proportional to the fusion rate. The rate of gas evolution, V1, is defined as gas volume released by fusion per weight of fused grain per unit time:

$$V1 = A \cdot \partial G(t)/\partial t \quad (1)$$

Here A is a proportional constant.

The formed grain is not dense enough to keep the fusion front isolated from the environment. Even if the inner surface of the crucible is covered by a dense glassy phase, air can pass through the unfused grain between the fused wall and the mold at the top of the crucible. The evacuation system therefore should handle this leaking gas in addition to the evolved gas. Leaking gas is found to be proportional to the amount of unfused grain. More exactly, it is found to be proportional to the third power of (1−erf(t)), where erf(t) is the error function and B is a proportional constant.

$$V2 = B \cdot (1 - \text{erf}(t))^3 \quad (2)$$

These two parameters, V1 and V2, are the main sources of gas to be removed by the evacuation means. The amount of evacuated gas is expressed in equation (3), where P is pumping power and C is normalized conductance of the flow passageway, i.e., $0 \leq C \leq 1$.

$$V3 = P \cdot C \quad (3)$$

At the fusion front of the grain-fused silica interface, gas flow is balanced between V3 and (V1+V2). If the total balance, V1+V2−V3, becomes positive, fused glass will contain more dissolved gas; if it exceeds a certain threshold, Q1, bubbles are introduced in the fused silica. If the balance is negative, fused silica contains less dissolved gas. A second threshold, Q2, can be used to make bubble-free glass, and another threshold, Q3, for no-bubble-growth characteristics. Here Q1 is not necessarily equal to Q2.

Q3 and Q2 are negative as expected. It has been determined that Q3 is more negative than Q2; i.e., Q3<Q2. After the VBT, which is an accelerated simulation of a CZ process, evolution or growth of bubbles is observed in traditional crucibles-even if the crucible is bubble-free as made. Evolution and growth of these bubbles results from the release of dissolved gas in the inner layer. The dissolved gas is related to the level of negativity of the balance (V1+V2−V3).

It is also found that bubble growth characteristics are strongly affected by the fusion temperature. Because the fusion rate increases with fusion temperature, high fusion rate results in the increase of released gas. It is critical to increase fusion temperature to meet NBG requirements. But if substantially all of the increased gas is not evacuated as it forms, bubbles will form, which is disadvantageous in the inner layer.

The goal in crucible manufacture is to design the apparatus to keep (V1+V2−V3) properly negative to satisfy BF+NBG requirement for the inner layer and NBG requirement for outer layer, while simultaneously meeting the layer thickness requirements. More specifically, (V1+V2−V3) can be controlled to create a BF+NBG inner layer and a NBG outer layer while making large crucibles (i.e., nominal sizes larger than 24-inch) using greater than 300 KVA DC arc supply (and preferably more than 950 KVA), and using an evacuation pump having a capacity of greater than 200 cubic meter per hour (free air displacement) and preferably greater than 350 cubic meter/hour.

The most prominent constraint point to creating such crucibles is the flow passageway, such as piping, joints and valves. It must have a greater than 10 cm² minimum cross-sectional area and preferably equal to or greater than about 50 mm circular diameter (that is, an area of about 19.6 cm²). This dimension is in sharp contrast to structures of the prior art, wherein such piping typically has a diameter of about 12 mm (i.e, an area of about 1.13 cm²).

The narrowest cross section is located at the interface with the formed grain; it is imperative that these channels be kept small enough to prevent grain from being drawn by reduced pressure into the evacuation system.

The individual openings of the flow passageway at the grain interface are each preferably at least 0.2 square centimeters (cm²), and more preferably at least 0.6 cm². The interface is equipped with a porous material, such as a porous graphite plug 26, with a cross-sectional area as abovementioned, and a maximum length of about 25 mm. For mechanical reasons, 12 mm has been found to be optimal.

A method for making the present crucible using the above-mentioned apparatus follows. It has been found that BF and NBG characteristics are primarily determined during transformation from silica grain to fused silica. Neither a pre-heat-treatment (such as calcination of grain) nor a post-heat-treatment (e.g., intense cooking after crucible fusion) is found to significantly alter the BF or NBG characteristics.

Another aspect of the invention is that vacuum level alone does not fully yield BF or NBG control; it is a dynamic balance of introduced and removed gas that has proved is essential. For NBG characteristics, released gas during crucible use in a CZ process is also essential. It has been determined that released gas is closely related to the fusion temperature. In other words, intense cooking is the key for NBG.

FIG. 2A shows changes in the key parameters in a prior art process as a function of fusion time. These graphs are derived according to a model based on the above equations. Variables for the rate of gas evolution, conductance of the flow passageway, fusion power (which is inversely proportional to the dissolved gas), and pump power, are selected for the model. As will be seen, when crucibles are fused according to the model parameters, the NBG and BF characteristics closely track those demonstrated in the model. At time zero, heating begins. The amount of fused silica (designated fuse in FIG. 2A) increases over time and saturates as it approaches the mold surface. Air (designated gasTr, for gas Transmitted, in FIG. 2A) is pulled through the formed grain bed by the pump, and gas released (designated gasEv, for gas Evolved, in FIG. 2A) by transformation of grain to the massive silica glass is evacuated by the pump. It will be seen that the sum of the gasTr and gasEv curves equal the Gas Total curve. It is this Gas Total amount that the pump pulls through the flow passageway to remove it from system 10. Gas Total approaches zero with time.

Figure 14A:
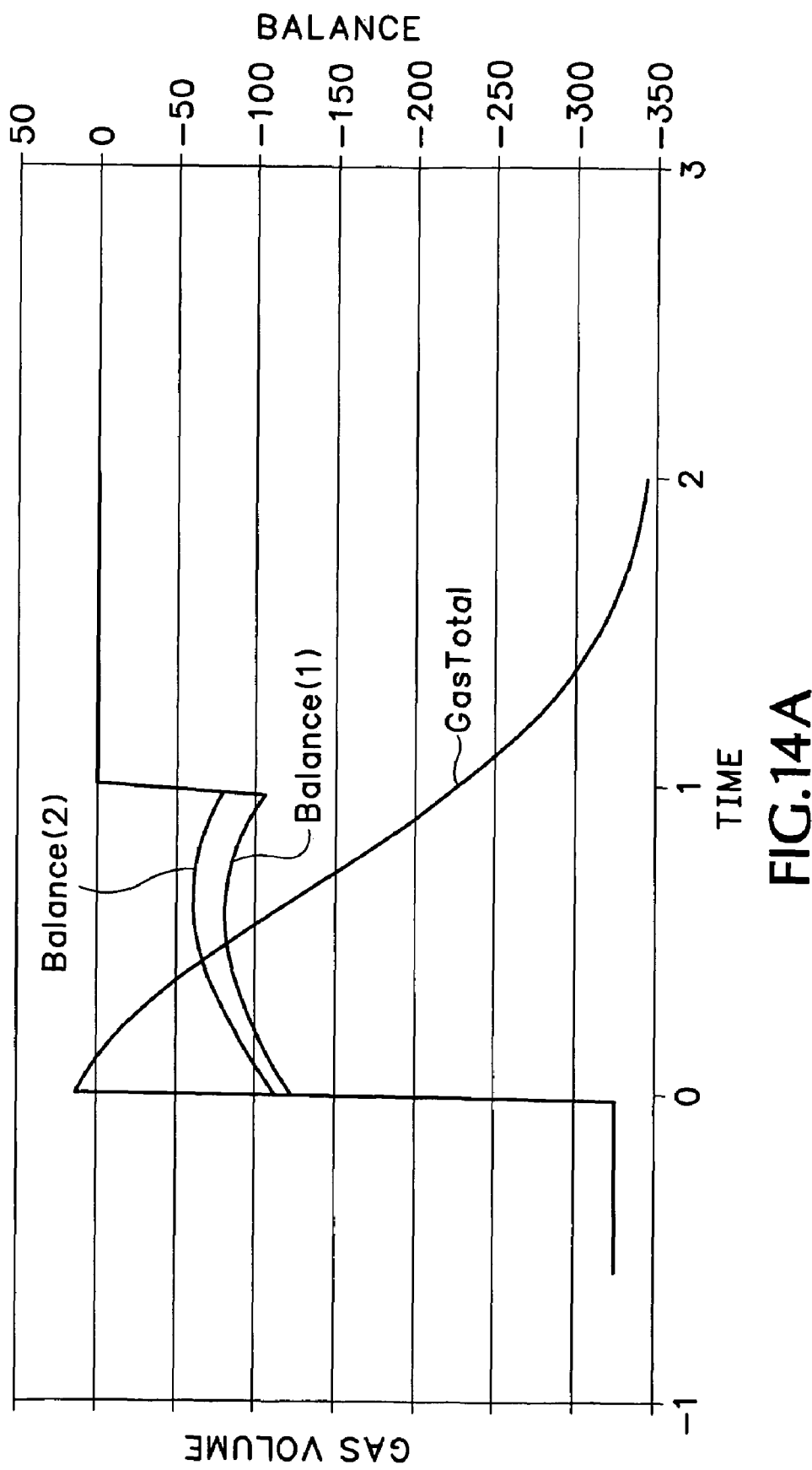
FIG. 14A depicts the balance profile curves and the total gas curve for a process for fusing a crucible in which a vent is open part way through the process to create bubbles in the outer wall.
Figure 14B:
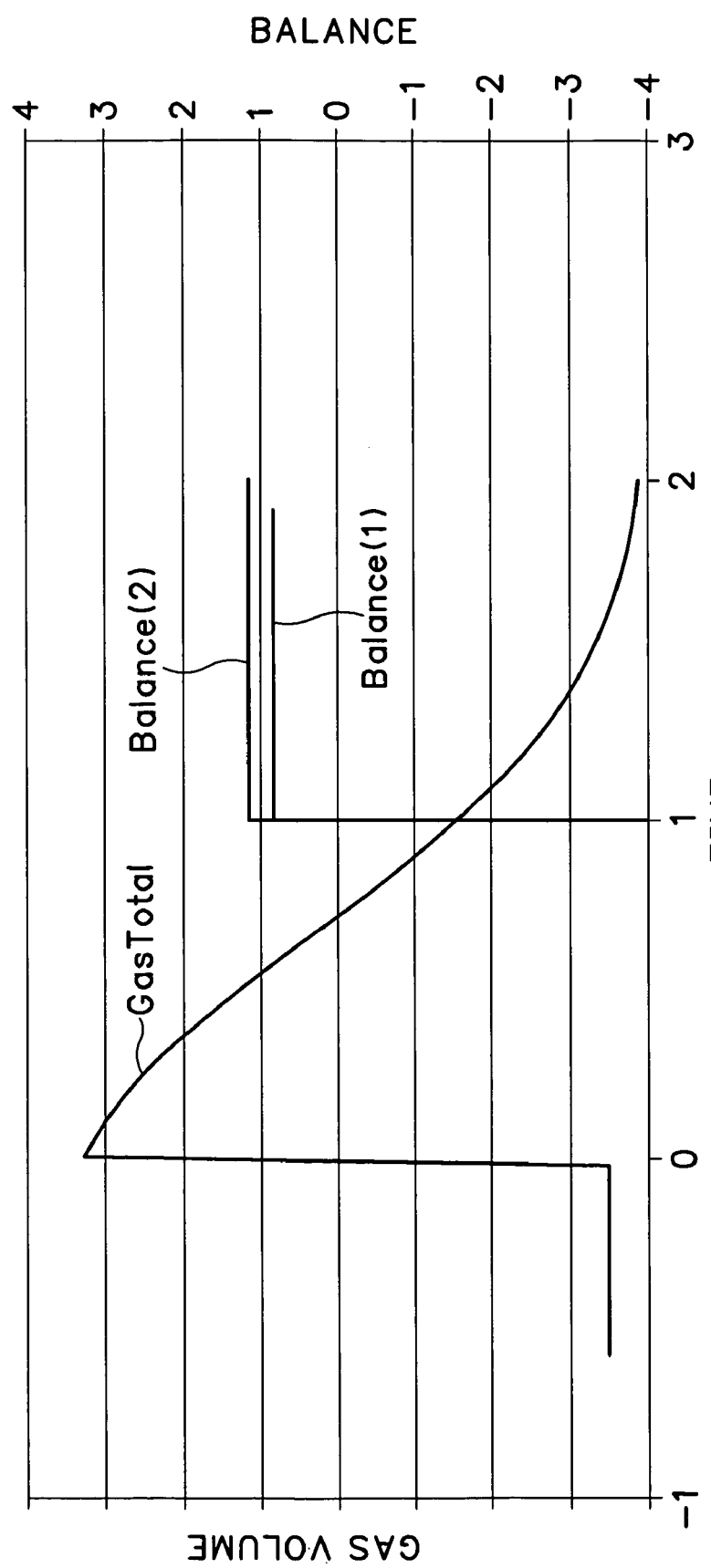
FIG. 14B is an enlarged scale view of a portion of the balance profile curves of FIG. 14A.

As mentioned separately, the crucible wall is required to have a translucent layer on its outer side. One way to achieve this is by reducing evacuation power halfway of the fusion process. The curves in FIG. 2A, however, are according to the above-described model and do not illustrate the actual process in which evacuation power is reduced. When using the process to form the crucible, at about time 5 in FIG. 2A, for example, evacuation power is reduced, and the process does not follow the dashed-line curves. Some of the other curves also use dashed-lines for the same reason. A model that incorporates reduction of evacuation power is shown in FIGS. 14A, 14B.

Figure 2B:
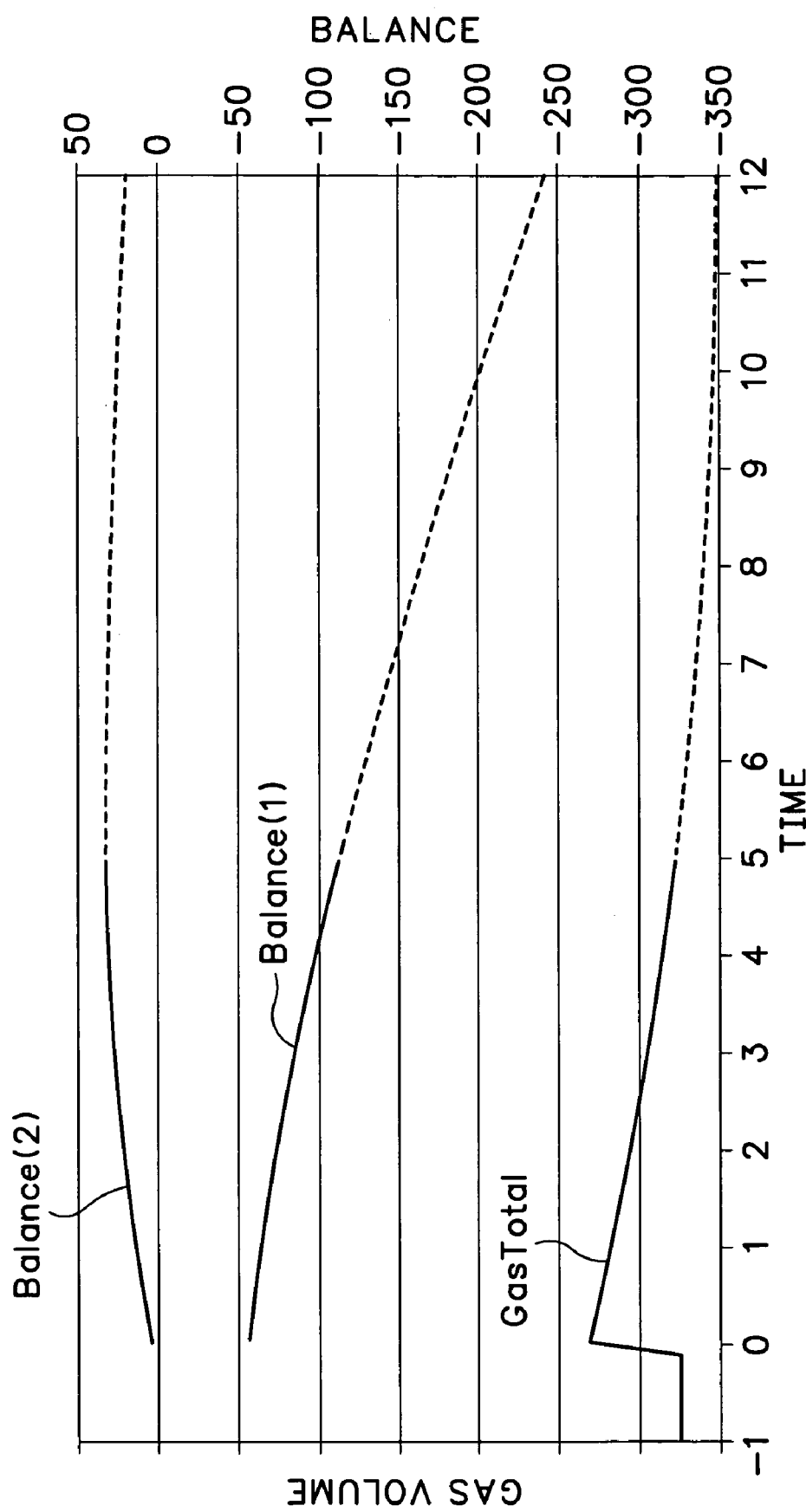
FIG. 2B is a graph depicting relationships between the rate at which gas is produced and evacuated during the fusion process of FIG. 2A and the rate at which dissolved gas is released during a vacuum bake test that simulates crucible conditions during the CZ process.

FIG. 2B shows the dynamic balance (designated Balance (1)), i.e., V1+V2−V3, for the process of FIG. 2A. If Balance (1) is negative—that is, below the horizontal zero line—the fused glass is free of bubbles. As fusion proceeds outwardly from inner surface, the time axis can be understood as reflecting the distance from the inner surface of the crucible to the outermost surface. Because Balance(1) is negative for the entire process, i.e., for the entire time the fusion front moves from the inner surface of the crucible wall to the outermost portion of the crucible wall, the entire wall is free of bubbles.

One can approximate the gas released during the VBT, which subjects the formed crucible to a simulated CZ process, as inversely proportional to the total gas evolved during fusion. In other words, the more gas evolves from the fused silica during fusion, the less is dissolved in the silica. And it is this dissolved gas that evolves into bubbles when the crucible is reheated during the CZ or VBT processes. The higher the fusion temperature, the more gas evolves during crucible fusion. As a result, a high fusion temperature is critical to creating NBG crucibles.

The graph for Balance(2) in FIG. 2B represents the dynamic balance that will be released during VBT or CZ processes. It includes a component that accounts for gas that is dissolved as opposed to being evacuated during the fusion process. Because Balance(2) is always greater than zero for the process of FIG. 2A, substantially the entire crucible wall is likely to show bubble growth or bubble evolution during VBT or CZ processes for crucibles made in the process of FIG. 2A.

In a first example using the parameters of FIG. 2A, a mold having a 620 mm diameter was used to form a crucible. The system included a minimum diameter of piping in the flow passageway of 15 mm; a pump capacity of 200 m$^3$/hour; a fusion energy of 350 KVA; interface opening diameters, like openings 22, 24 in FIG. 1, of 10 mm; and air channels, like channel 18, having a length of 12 mm.

All of these crucibles are required to have an opaque outer layer, which is created by forming bubbles in the outer layer. In this example, the fusion power was reduced about half way through the process to form bubbles in the outer layer, although this is not reflected in FIGS. 2A and 2B. This process produced a BF inner layer, but there was significant bubble growth and bubble evolution after the VBT. This was predicted by the model as shown in FIG. 2B, i.e., Balance(2) is positive throughout the process.

Figure 3A:
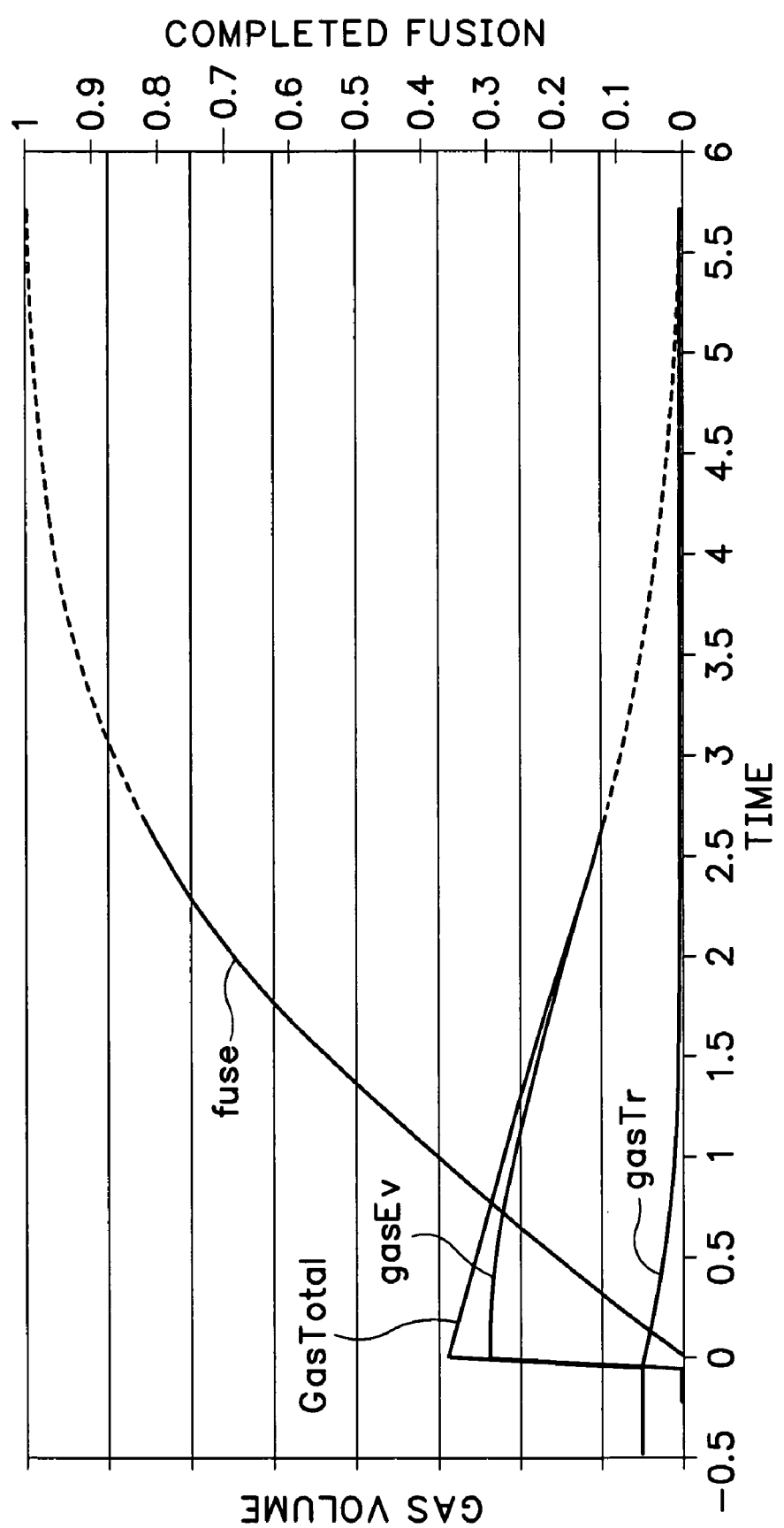
FIGS. 3A and 3B are graphs similar to FIGS. 2A and 2B depicting another process for fusing a crucible.
Figure 3B:
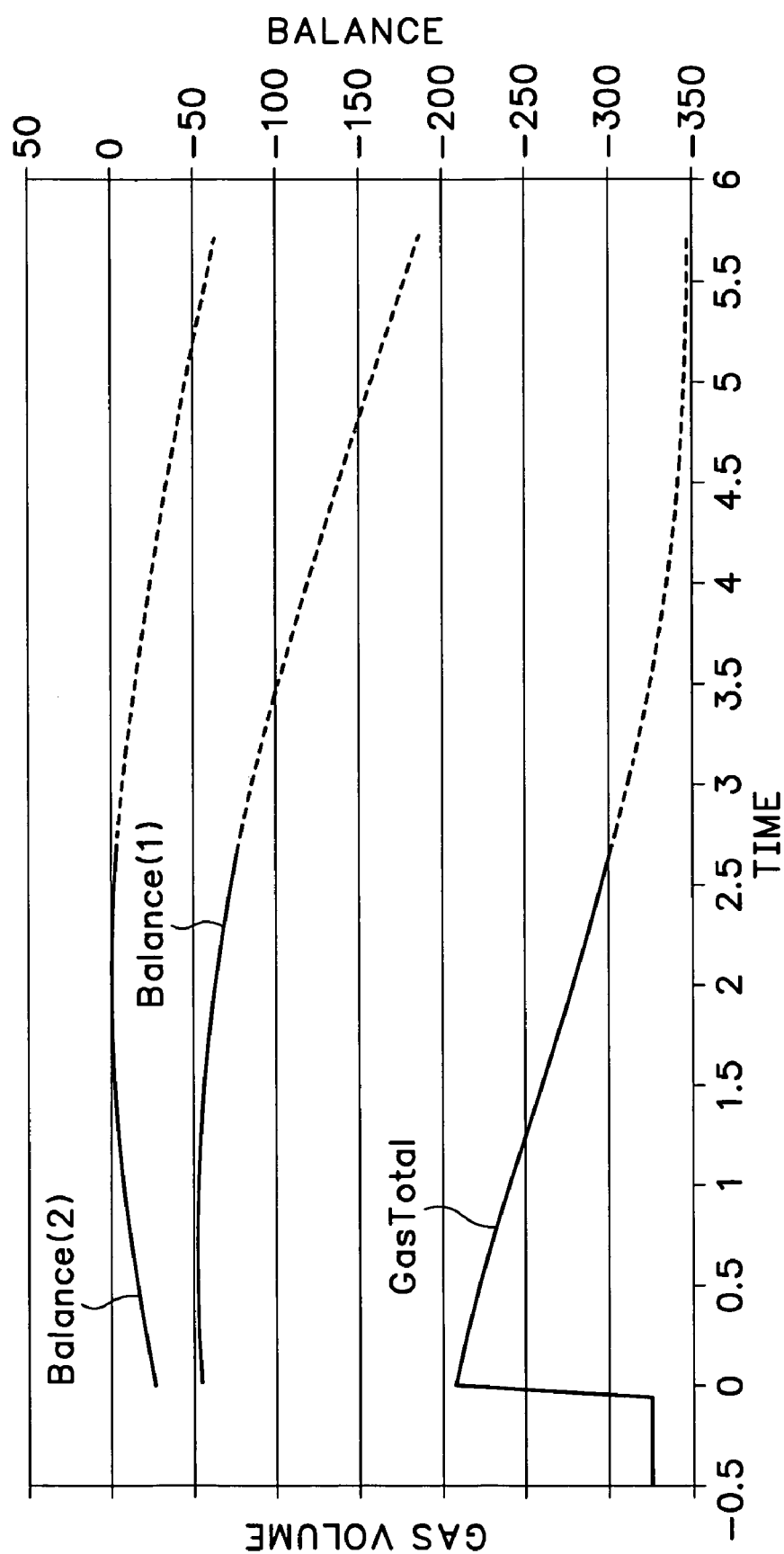

FIG. 3A demonstrates the same conditions as FIG. 2A except fusion power is higher. As fusion proceeds more rapidly, the units for the time axis are not the same as FIGS. 2A and 2B. The evolved gas (during fusion) is much higher than in FIG. 2A. As a result, the gas released during the VBT is less. The Balance(2) curve in FIG. 3B is less than the zero throughout the process. The crucible resulting from FIG. 3 has a BF+NBG character across the entire crucible wall because both Balance(1) and Balance(2) are less than zero.

In a second example that corresponds generally to FIG. 3A, the same parameters were used as in the first example except that the fusion power was boosted to 500 KVA. This resulted in a crucible that was almost wholly BF and exhibited very little bubble evolution or growth after VBT. These qualities are reflected in FIG. 3B. As can be seen by comparing FIGS. 2A and 2B, this crucible was produced faster than the first example.

Figure 4A:
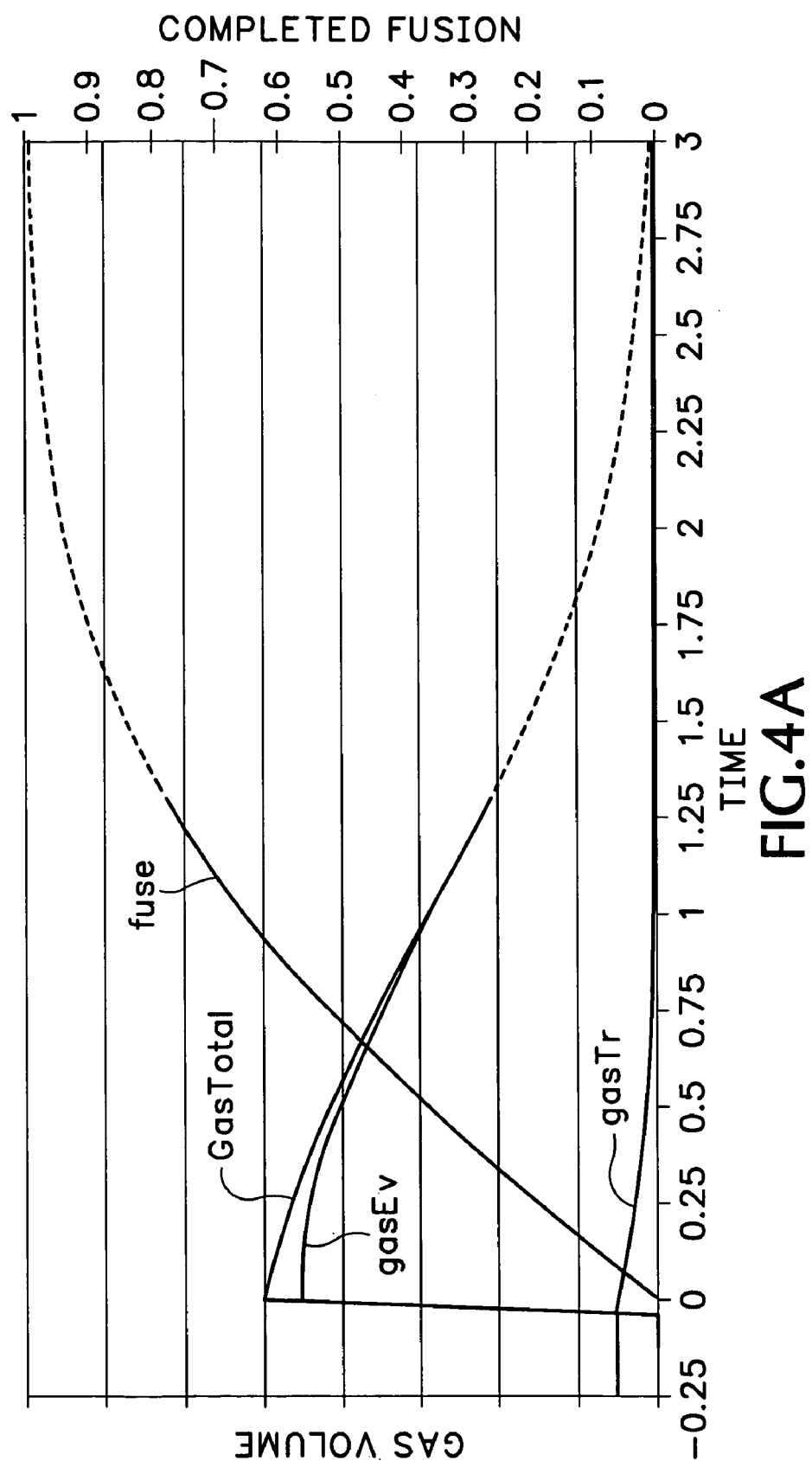
FIGS. 4A and 4B are graphs similar to FIGS. 2A and 2B depicting still another process for fusing a crucible.
Figure 4B:
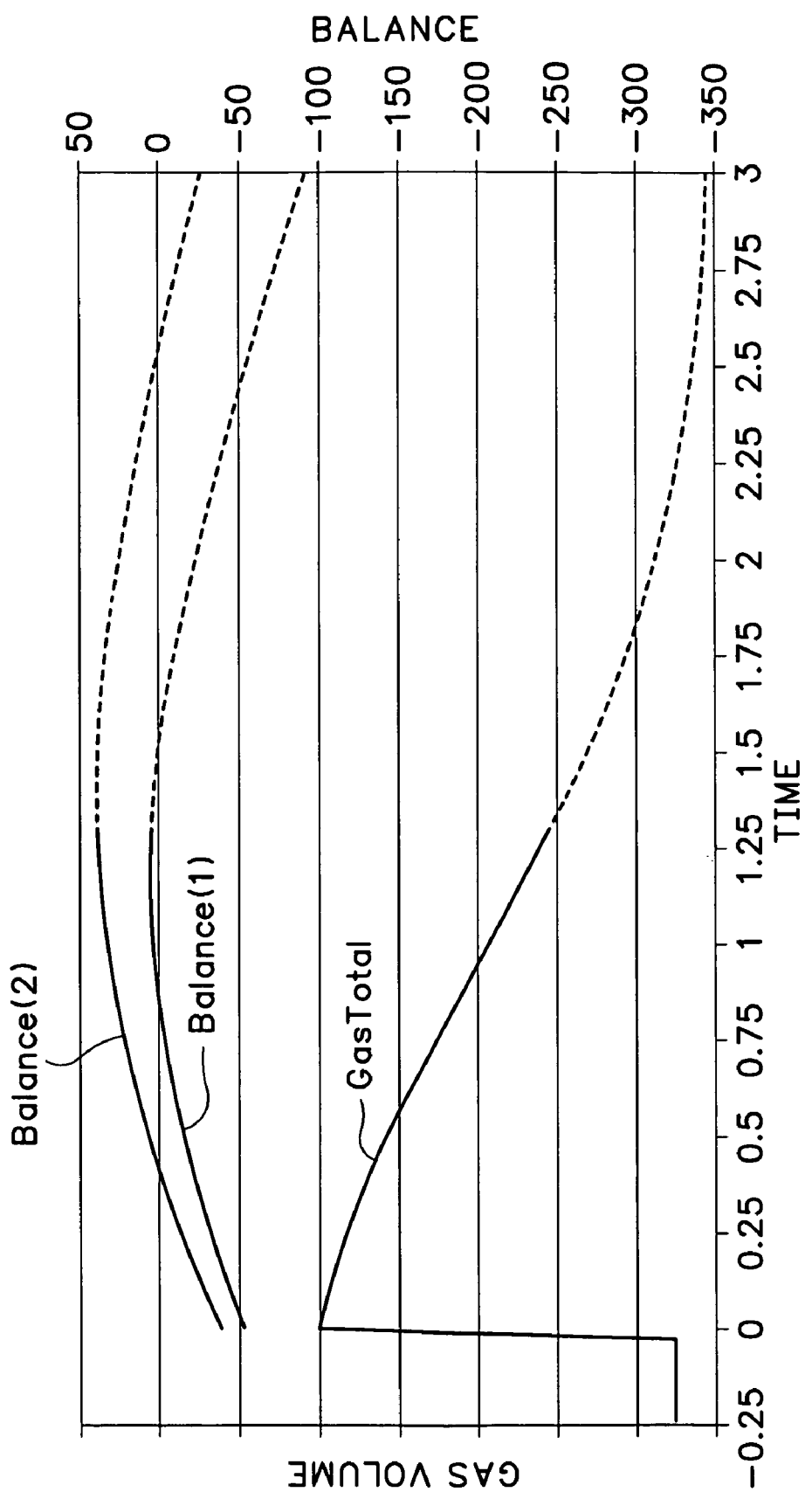

FIG. 4A shows the case when the fusion power is increased even more. Other than the power level, and thus a higher fusion rate, conditions are the same as in FIGS. 2 and 3. FIG. 4B shows that the crucible has a bubble-free innermost layer, a slight bubble layer in the mid-wall because Balance(1) is greater than zero for a time midway through the process while the middle of the wall is fused. In addition, there is bubble growth during the VBT around the middle bubble layer because Balance(2) is also above zero during the middle of the fusion process.

In a third example that corresponds generally to FIG. 4A, the same parameters were used as in the second example, except the power was again raised, to 700 KVA. This again produced a BF and NBG crucible and again decreased the time to form the crucible.

Figure 6:
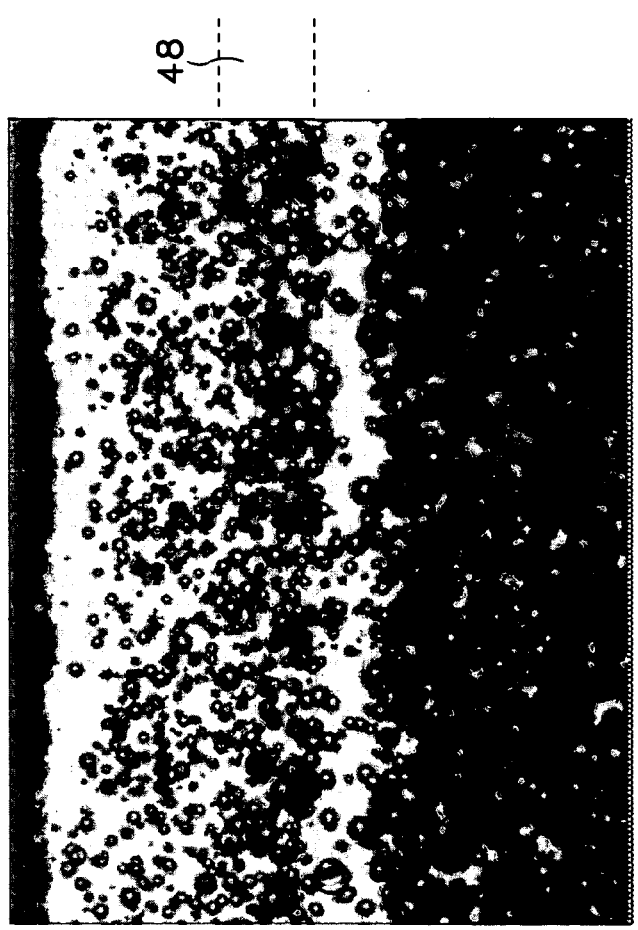
FIG. 6 is a photomicrograph of a section of the wall of a crucible that was constructed generally in accordance with the process of FIGS. 4A and 4B after the crucible was subject to a vacuum bake test.
Figure 5:
FIG. 5 is a photomicrograph of a section of the wall of a crucible that was constructed generally in accordance with the process of FIGS. 4A and 4B.

FIGS. 5 and 6 are photographs of a crucible wall after formation and after the VBT, respectively, of a crucible made in accordance with the parameters used for the model illustrated in FIG. 4A. The upper portion of each photograph is the inner surface of the crucible, and the distance from the top of the photograph to the bottom is about 8 mm. As can be seen in FIG. 5, the lower half of the crucible wall includes bubbles that are intentionally created to diffuse heat during the CZ process. This bubble layer is created by breaking the balance to the positive side. This is accomplished by controlled opening of a vent attached to the evacuation system after the required amount of the inner layer is fused. (See FIGS. 14A, 14B).

The inner layer includes a band of evolved bubbles 48 after the VBT, which was predicted by the portion of Balance(2) in FIG. 4B that is above zero.

Figure 7A:
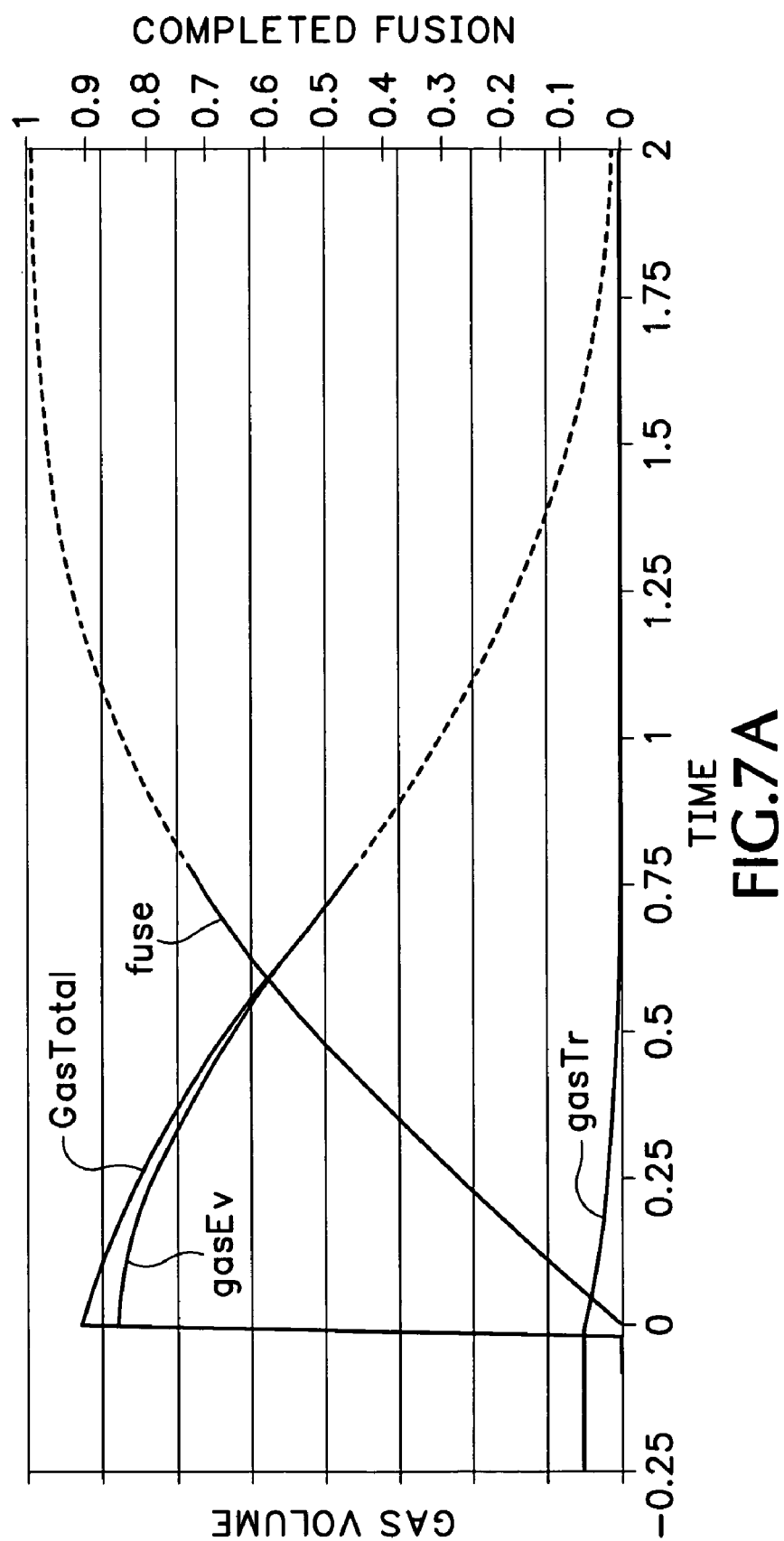
FIGS. 7A and 7B are graphs similar to FIGS. 2A and 2B depicting yet another process for fusing a crucible.
Figure 7B:
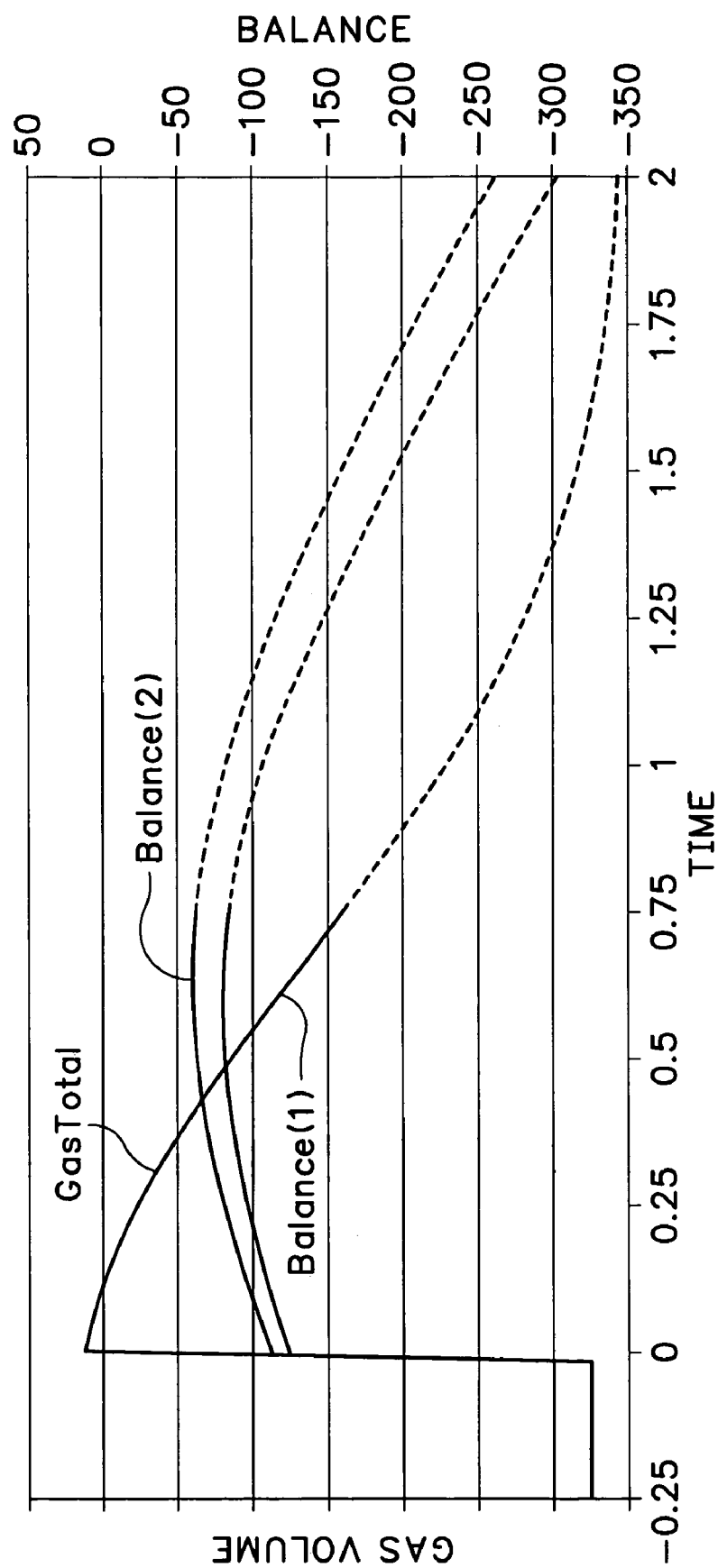
Figure 7B:
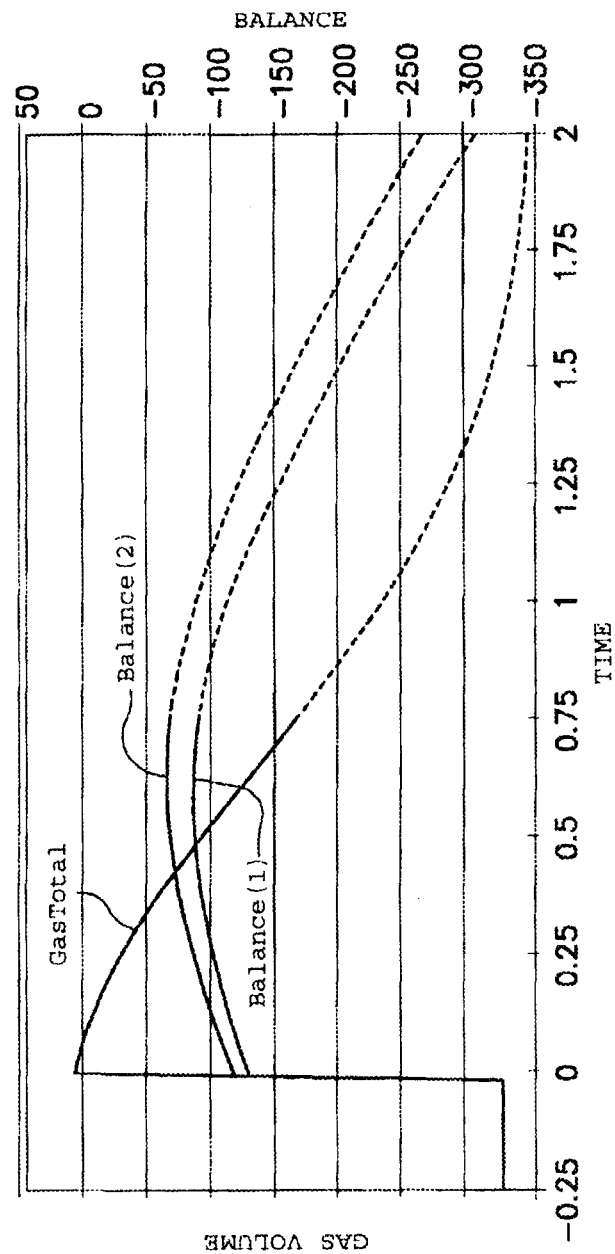

FIGS. 7A and 7B illustrate an example wherein conditions are the same as in FIG. 4 but with increased conductance of the flow passageway, increased fusion power, and increased pumping capacity. The Balance(2) curve is pushed down below zero. As a result, bubble growth is eliminated. In FIG. 7, fusion power is intense, the vacuum pump is strong, and piping conductance is high. Gas evolution is observed to be quite high during fusion in this example. As can be seen by the negative levels in the FIG. 7B Balance(2) curve evolved gas during the VBT is small because of substantially complete cooking.

The Balance(2) curve is well below the zero line throughout the fusion process, meaning that the crucible will be very stable and will exhibit minimal bubble formation and bubble growth when used in a CZ process.

In a fourth example that corresponds generally to FIG. 7A, the parameters are the same as in the third example except that the minimum bore diameter in the flow passageway is 50 mm, the pumping capacity is 350 m$^3$/hour, and the fusion energy is 1200 KVA. When fusing this crucible, electric power is supplied to reach 500 KVA no more than 45 seconds after power is first applied. FIGS. 7A and 7B represent an ideal case where the maximum power is immediately applied at the start of the process, which is not achievable in practice. If power is slowly increased at the beginning, rather than quickly as in the fourth example, i.e., 500 KVA within 45 seconds, the crucible inner surface may fuse more like the FIG. 2A crucible and related example. It is therefore preferable to increase the power as rapidly as possible to the desired fusion energy.

In this example, pump flow rate was reduced by about 50% half way through the process, although this is not reflected in FIGS. 7A and 7B. This creates bubbles in the outer 50% of the wall. As fused, the inner layer is free of bubbles and both layers exhibit very little bubble evolution or growth. Photos of this crucible are shown in FIGS. 9A and 9B and a variation in FIGS. 10A and 10B and are discussed below.

Turning now to the microphotographs of FIGS. 8, 9, and 10, in FIG. 8A, a prior art section of a crucible wall is shown with the inner layer being on the left and the outer layer on the right. This crucible was made generally in accordance with the process described in U.S. Pat. No. 4,935,046. As can be seen in FIG. 8B, which depicts the same section after the VBT, the innermost layer remains substantially bubble free, but the outer layer demonstrates substantial bubble growth. The wall thickness after the VBT increased by 13.5%, and the apparent density of the outer layer decreased to 1.70 grams/cm$^3$.

FIGS. 9A and 9B illustrate a crucible made generally in accordance with the parameters used in the model depicted in FIG. 7A, except that the outer layer was not controlled for NBG. This was accomplished by reducing the evacuation power about half way through the fusion process by opening a vent in the evacuation system. As previously noted, the models discussed thus far do not illustrate the change of parameters part way through the crucible formation to create the bubbles that are necessary in the outer layer. This can be accomplished by decreasing flow passageway conductance, reducing pumping power, or decreasing fusion power. But when fusion power is decreased, more gas is dissolved, which leads to bubble evolution and growth during the VBT or CZ process. One model disclosed herein address the parameter change necessary to inject bubbles in to the outer wall, which will be addressed shortly with reference to FIG. 14. Because the outer layer in the FIG. 9 crucible was not controlled for NBG, there is significant bubble evolution after the VBT with a wall thickness increase of 4.7% and a decrease of apparent density of the outer layer to 1.89 grams/cm$^3$.

Finally, in a preferred embodiment, according to the FIG. 7A parameters, in FIG. 10A, after fusion, and FIG. 10B, after the VBT, the wall thickness increase after the VBT is only 0.9% and the outer layer apparent density is 2.12 grams/cm$^3$. Like the crucible of FIG. 9, the FIG. 10 outer wall was formed by reducing evacuation power through the fusion process, but it was not reduced as much as in the FIG. 9 approach. More exactly, the crucible shown in FIGS. 9A, 9B was fused by opening the vent completely after fusing inner layer, which is common practice in this industry. On the other hand, the crucible shown in FIGS. 10A, 10B, was fused while carefully controlling the balance by controlling the degree of venting and the pump rate. The FIG. 10 crucible is exceptionally well suited for using the CZ process to pull multiple large ingots.

Figure 11A:
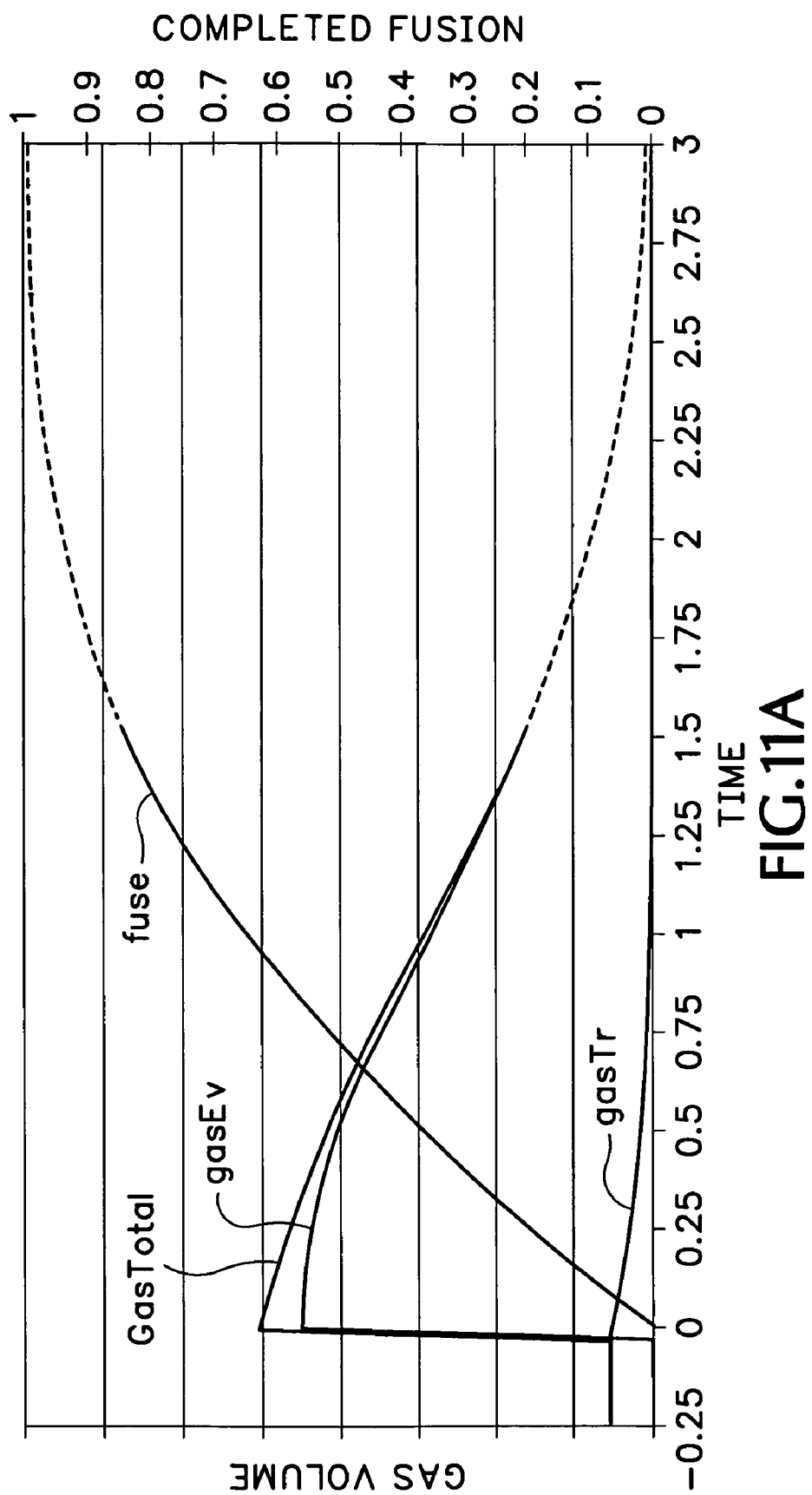
FIGS. 11A and 11B are graphs similar to FIGS. 2A and 2B depicting still another process for fusing a crucible.
Figure 11B:
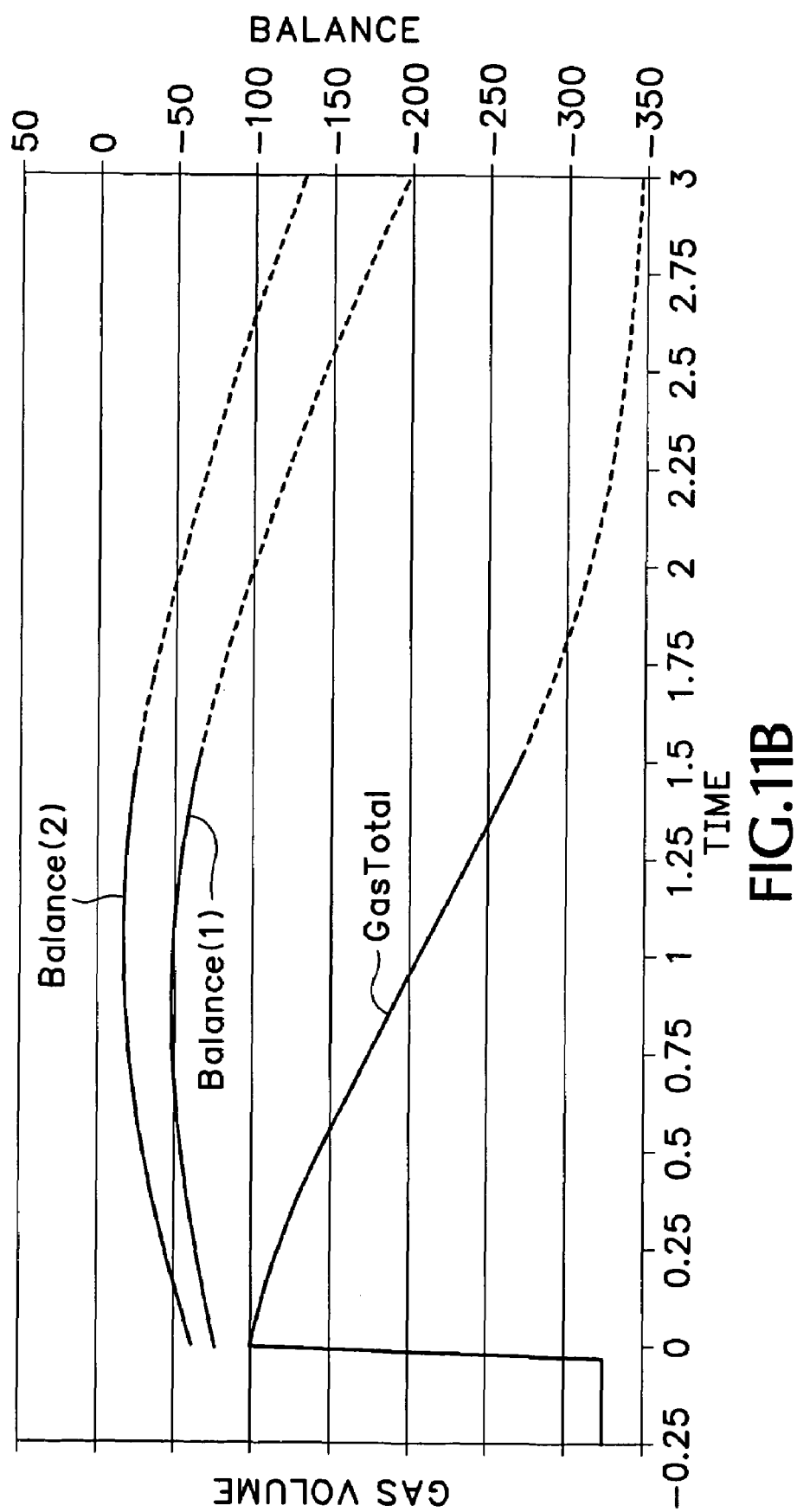

FIGS. 11A and 11B demonstrate another process for forming a crucible in which fusion power and pump power are reduced compared to previous examples, while Balance (1) and Balance(2) are maintained negative throughout the process. Decreasing power while maintaining BF and NBG layer characteristics are especially important when fusing natural quartz grain having a high aluminum concentration.

Figure 12:
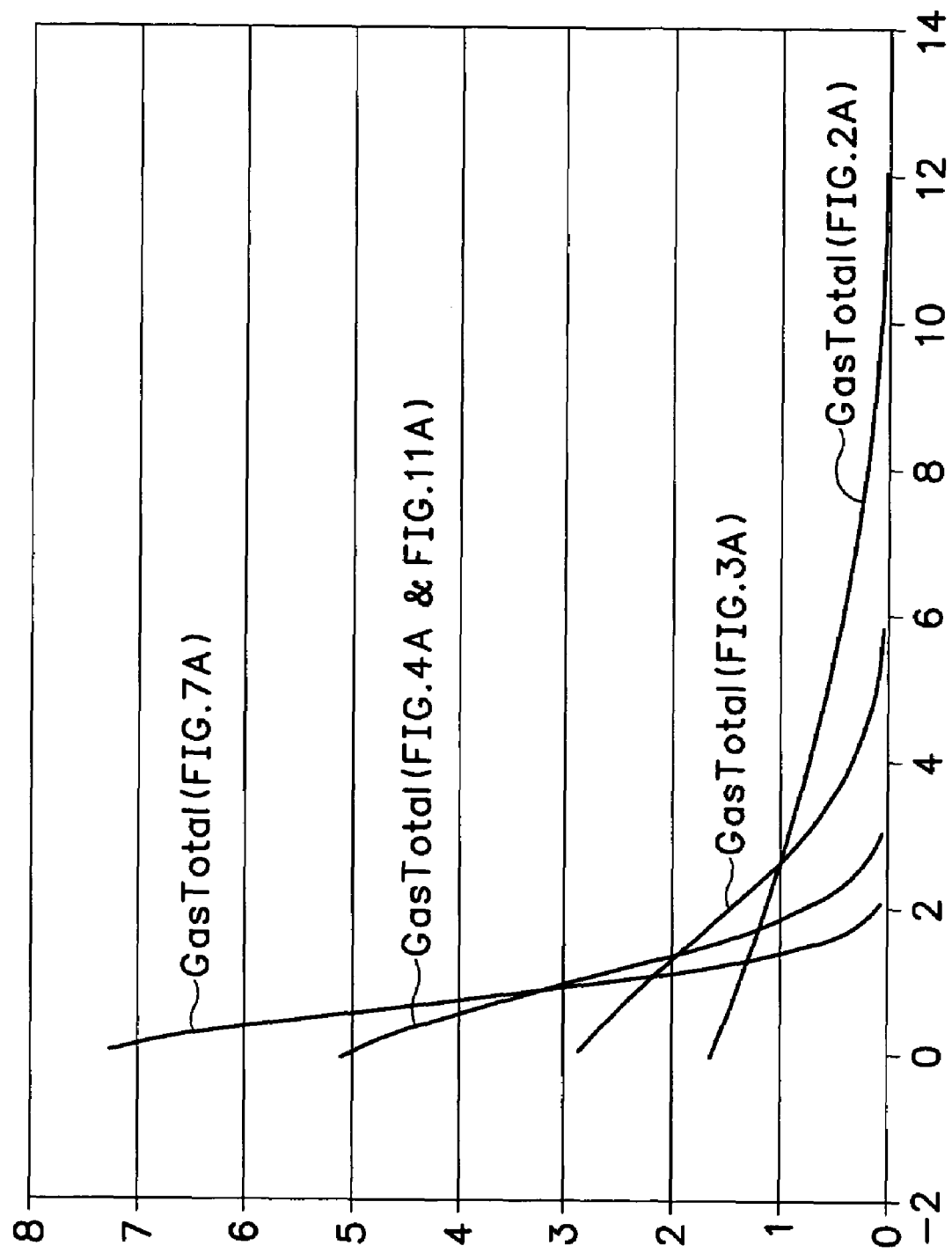
FIG. 12 depicts the total gas curves from FIGS. 2A, 3A, 4A, 7A, and 11A superimposed over one another.
Figure 13:
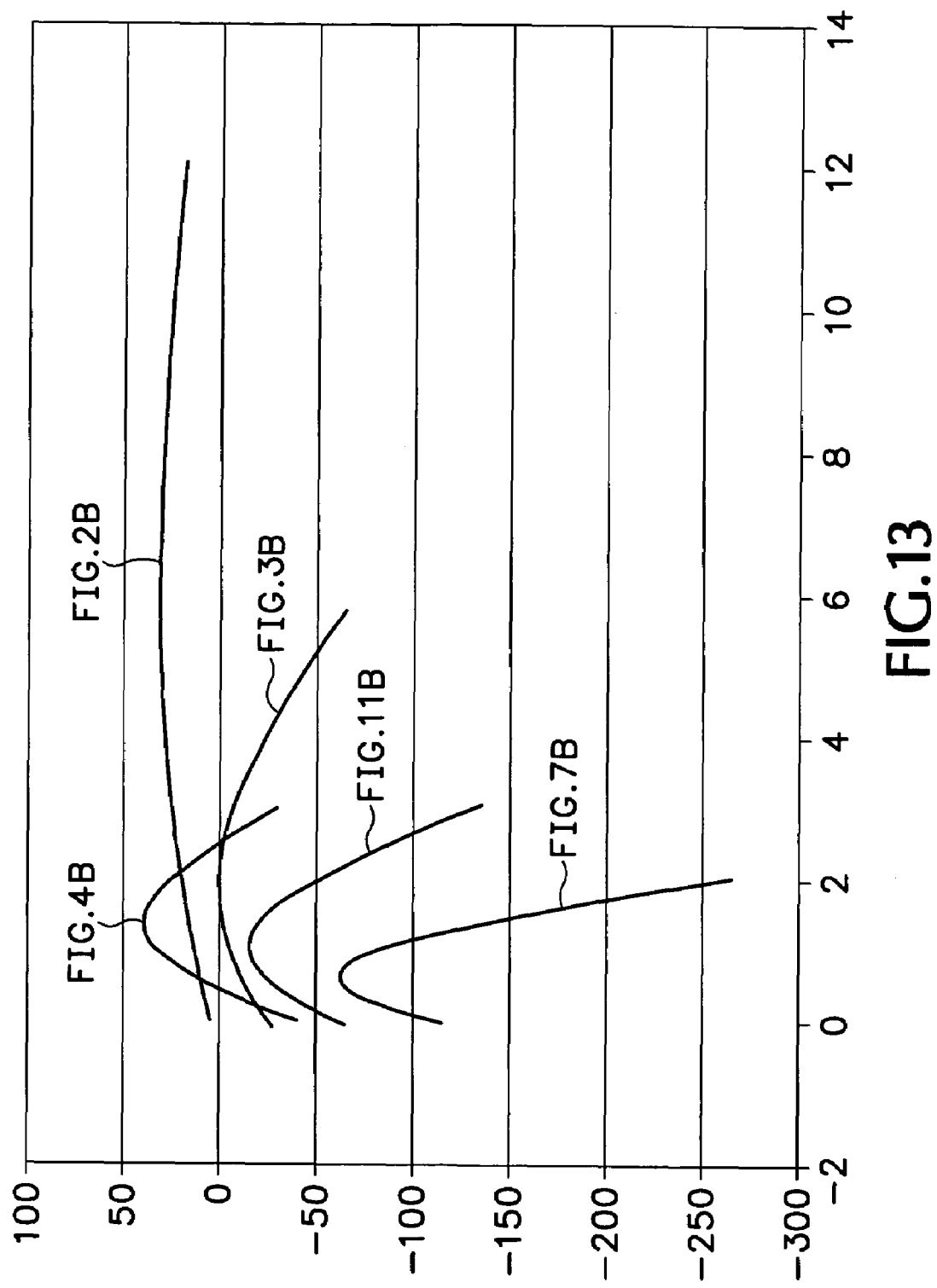
FIG. 13 depicts the balance profile curves for the vacuum bake test simulation (balance (2) curves) from FIGS. 2B, 3B, 4B, 7B, and 11B superimposed over one another.

In another example that corresponds generally to the FIG. 11A parameters, the parameters are the same as in the fourth example, except that pump capacity is reduced to 200 meter$^3$/hour and the fusion energy is reduced to 700 KVA. This increases the time required to fuse the crucible as can be seen in FIGS. 12 and 13. Again this produced excellent NBG and BF characteristics.

Silica is a rather fast-sublimating element, and during fusion, silica sublimates from the inner surface. Slower-sublimating elements, such as aluminum, are left in the innermost layer. This phenomenon of aluminum accumulation occurs with other metallic impurities in natural silica grain, e.g. Na, K, Ca, Fe, which may be used as charge compensators. This impure innermost layer, normally less than 20 micrometers, can have negative consequences for a CZ process. Using this approach satisfies goals for purity of the innermost layer while achieving BF and NBG characteristics of the whole wall. This example is an advantageous solution for this compromise.

The fusion power, or cooking intensity, is critical for reducing the dissolved gas, which evolves into bubbles and bubble growth during the VBT or CZ process. It has been found, contrary to the prior art view, that faster fusion does not always produce a better crucible. This finding is contrary to conventional wisdom that the faster the fusion, the better the crucible.

Released gas during fusion over time is shown in FIG. 12, having the same time scale as in FIGS. 2A, 3A, 4A, 7A, and 11A. As the FIGS. 4A and 7A models use the same level of fusion power, the curves are overlapped. Naturally, gas is released more rapidly at higher heating. The gas amount balance, Balance(2), at the fusion front is shown in FIG. 13 with the same time scale. The slower fusion case, such as Case 3A, is better than faster fusion, such as Case 4A. The BF and NBG quality of the crucible is controlled by balancing the evacuation of the gasses according to the model equations.

Finally, FIG. 14A is a plot of a model showing a reduction in pump capacity about half way through the process of forming the crucible. This reduction can be achieved by venting the flow passageway to atmospheric pressure, by reducing conductance of the passageway, or by reducing pump speed. FIG. 14B shows the balance profile curves after reduction of pump capacity on an enlarged balance scale. Because both curves are close to zero, good NBG characteristics are obtained while permitting bubbles to form in the outer layer.

Another way to view the balance that is necessary to achieve desirable crucible characteristics is to consider the mass of the gas evolved and the gas drawn through the grain during fusion, i.e., Gas Total on the models. If the fusion power is high but either the conductance of the flow passageway or the pump capacity, or both, are low, the gas atoms cannot be pumped away from the fusion front at a rate that prevents the gas from being dissolved into the silica. As noted, this causes growth of existing bubbles and evolution of bubbles in the crucible wall during the VBT or CZ process.

But if the fusion power, conductance, and pump capacity are sufficiently high, crucibles can be made in a relatively short time with excellent BF and NBG characteristics. In addition, bubbles in the outer wall can be formed by reducing conductivity or pump speed to a level that causes bubble to form, but not to level that dissolves evolved gas into the silica. As a result, formation of bubbles in the outer layer, which is necessary and desirable, can be accomplished while fusing the crucible to prevent (a) bubbles from forming in the inner layer and (b) bubbles from growing or evolving throughout the crucible wall.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments thereof as disclosed and illustrated herein are not to be considered in a limiting sense. Indeed, it should be readily apparent to those skilled in the art in view of the present description that the invention can be modified in numerous ways. The inventor regards the subject matter of the invention to include all combinations and subcombinations of the various elements, features, functions and/or properties disclosed herein.

The invention claimed is:

1. A silica glass crucible having multiple layers comprising:
    an inner layer having a thickness of greater than approximately 2.0 mm and after a vacuum bake test in which the crucible is heated at approximately 1650 degrees C for approximately three hours at a pressure of approximately 0.1 Pa containing less than about 1% bubbles by volume in cross-sectional area, the diameter of the bubbles being less than about 0.3 mm;
    an outer layer having an apparent density after the vacuum bake test of equal to or greater than about 2.05 grams/cm$^3$; and
    a crucible wall comprising at least the inner and outer layers, said wall increasing in thickness equal to or less than about 3% after the vacuum bake test.

2. The crucible of claim 1 wherein increase in thickness of the crucible wall after the vacuum bake test is equal to or less than about 1%.

3. A quartz crucible with an outer diameter of about 620 millimeters or more comprising:
    an opaque silica glass outer layer; and
    a transparent silica glass inner layer greater than approximately 2 millimeters thickness and having less than about 1% bubbles by volume in cross-sectional area after heating at approximately 1650 degrees C for approximately three hours at a pressure of approximately 0.1 Pa.

4. The quartz crucible of claim 3 wherein after heating at approximately 1650 degrees C for approximately three hours at a pressure of approximately 0.1 Pa, the crucible wall increases in thickness less than about 3%.

5. The quartz crucible of claim 4 wherein after heating at approximately 1650 degrees C for approximately three hours at a pressure of approximately 0.1 Pa, the crucible wall increases in thickness less than about 1%.

6. The quartz crucible of claim 3 wherein after heating at approximately 1650 degrees C for approximately three hours at a pressure of approximately 0.1 Pa, the bubbles in the inner layer increase less than about 0.3 millimeter in diameter.

7. The quartz crucible of claim 3 wherein after heating at approximately 1650 degrees C for approximately three hours at a pressure of approximately 0.1 Pa, the outer layer has a density of greater than about 2.05 grams/cm$^3$.

8. A fused silica crucible made according to the following method:
    rotating a mold having an inner mold surface defining a mold cavity and further having plurality of air channels formed in the mold and communicating with the inner surface;
    forming silica grain in the rotating crucible mold;
    heating the formed silica grain by applying electric power to electrodes positioned in the mold cavity;
    evacuating gas from the mold cavity at a first flow rate with an evacuation system configured to draw gas from the mold cavity into the air channels;
    continuing heating until an inner crucible layer approximately 2.0 mm thick is formed;
    changing the flow rate of gas evacuation to a second flow rate; and
    continuing heating until a second crucible layer is formed.

9. The quartz crucible of claim 8 wherein after heating at approximately 1650 degrees C for approximately three hours at a pressure of approximately 0.1 Pa, the crucible wall increases in thickness less than about 3%.

10. The quartz crucible of claim 9 wherein after heating at approximately 1650 degrees C for approximately three hours at a pressure of approximately 0.1 Pa, the crucible wall increases in thickness less than about 1%.

11. The quartz crucible of claim 8 wherein after heating at approximately 1650 degrees C for approximately three hours at a pressure of approximately 0.1 Pa, bubbles in the inner layer increase less than about 0.3 millimeter in diameter.

12. The quartz crucible of claim 8 wherein after heating at approximately 1650 degrees C for approximately three hours at a pressure of approximately 0.1 Pa, the second layer has a density of greater than about 2.05 grams/cm$^3$.

13. The quartz crucible of claim 8 wherein after heating at approximately 1650 degrees C for approximately three hours at a pressure of approximately 0.1 Pa, bubbles in the inner layer have less than about 1% bubbles by volume in cross-sectional area.

14. A fused silica crucible made according to the following method:
    feeding silica grain along an inner surface of a rotating mold to arrange the grain in a crucible shape having a radially inner surface open to an interior space of the mold and a radially outer surface adjacent an inner wall of the mold;
    heating the grain from the interior space of the mold;
    drawing air through the grain and into ports distributed in the inner wall of the mold;
    evolving gas from the heated grain;
    establishing a fission front that begins at the radially inner surface and proceeds toward the radially outer surface;
    maintaining a pressure differential between the fission front and the inner wall of the mold that draws gas away from the fission front at a rate faster than it is introduced until the silica grain forms a transparent glass layer greater than approximately 2 millimeters; and
    thereafter reducing the pressure differential between the fission front and the inner wall of the mold to a rate at which gas is drawn away from the fission front at a rate slower than it is introduced.

15. The quartz crucible of claim 14 wherein after heating at approximately 1650 degrees C for approximately three hours at a pressure of approximately 0.1 Pa, the crucible wall increases in thickness less than about 3%.

16. The quartz crucible of claim 15 wherein after heating at approximately 1650 degrees C for approximately three hours at a pressure of approximately 0.1 Pa, the crucible wall increases in thickness less than about 1%.

17. The quartz crucible of claim 14 wherein after heating at approximately 1650 degrees C for approximately three hours at a pressure of approximately 0.1 Pa, bubbles in the transparent glass layer increase less than about 0.3 millimeter in diameter.

18. The quartz crucible of claim 14 wherein after heating at approximately 1650 degrees C for approximately three hours at a pressure of approximately 0.1 Pa, a layer radially outward from the transparent glass layer has a density of greater than about 2.05 grams/cm$^3$.

19. The quartz crucible of claim 14 wherein after heating at approximately 1650 degrees C for approximately three hours at a pressure of approximately 0.1 Pa, bubbles in the transparent glass layer have less than about 1% bubbles by volume in cross-sectional area.

* * * * *

UNITED STATES PATENT AND TRADEMARK OFFICE
CERTIFICATE OF CORRECTION

PATENT NO. : 7,383,696 B2  Page 1 of 1
APPLICATION NO. : 11/223158
DATED : June 10, 2008
INVENTOR(S) : Kemmochi et al.

It is certified that error appears in the above-identified patent and that said Letters Patent is hereby corrected as shown below:

At column 11, line 52, please replace "healing" with --heating--

At column 12, line 48, please replace "fission" with --fusion--

At column 12, line 50, please replace "fission" with --fusion--

At column 12, line 52, please replace "fission" with --fusion--

At column 12, line 57, please replace "fission" with --fusion--

At column 12, line 58, please replace "fission" with --fusion--

Signed and Sealed this

Eleventh Day of November, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,383,696 B2 |
| APPLICATION NO. | : 11/223158 |
| DATED | : June 10, 2008 |
| INVENTOR(S) | : Kemmochi et al. |

It is certified that error appears in the above-identified patent and that said Letters Patent is hereby corrected as shown below:

The drawing sheet, consisting of Fig. 7B should be deleted to be replaced with the drawing sheet, consisting of Fig. 7B, as shown on the attached page.

Signed and Sealed this
Fourth Day of January, 2011

David J. Kappos
*Director of the United States Patent and Trademark Office*